United States Patent [19]
Sly et al.

[11] 3,938,602
[45] Feb. 17, 1976

[54] SLICING SYSTEM WITH AUTOMATIC PORTION WEIGHT CONTROL

[76] Inventors: Eugene L. Sly, P.O. Box 19545, Portland, Oreg. 97219; Dean R. Salmans, 5007 Wildwood Drive, North Bend, Oreg. 97459

[22] Filed: July 19, 1974

[21] Appl. No.: 490,419

[52] U.S. Cl. .......... 177/116; 177/184; 177/DIG. 6; 83/77; 83/707
[51] Int. Cl.² G01G 13/02; G01G 21/10; B26D 7/00; B26D 7/06
[58] Field of Search ....... 177/46, 60, 164, 116, 173, 177/184, DIG. 6

[56] References Cited
UNITED STATES PATENTS

| | | | |
|---|---|---|---|
| 2,775,444 | 12/1956 | Hadley | 177/184 X |
| 2,812,792 | 11/1957 | Allbright | 177/DIG. 6 |
| 2,903,032 | 9/1959 | Cerrene | 177/DIG. 6 |
| 2,926,010 | 2/1960 | Kennaway et al. | 177/DIG. 6 |
| 3,123,164 | 3/1964 | Echenique et al. | 177/DIG. 6 |
| 3,189,110 | 6/1965 | Yarborough | 177/46 X |
| 3,458,003 | 7/1969 | Garvey | 177/173 X |
| 3,826,318 | 7/1974 | Baumgartner | 177/DIG. 6 |

Primary Examiner—George H. Miller, Jr.
Attorney, Agent, or Firm—Oliver D. Olson

[57] ABSTRACT

A slicing system for automatically controlling the weight of individually sized portions of a sliced food product includes an automatic electric slicer and a scale operably associated therewith for weighing slices of a food product cut by the slicer. A photoelectric element disposed adjacent the path of the movable pointer on the scale detects the proximity of such pointer at a preselected location corresponding to a preselected weight of food product being received upon the receiving platform of the scale and opens the circuit to the slicer to stop the same. Adjusting means are provided to establish the relative position of the photoelectric element and the scale pointer for causing the circuit to break at such selected position.

3 Claims, 7 Drawing Figures

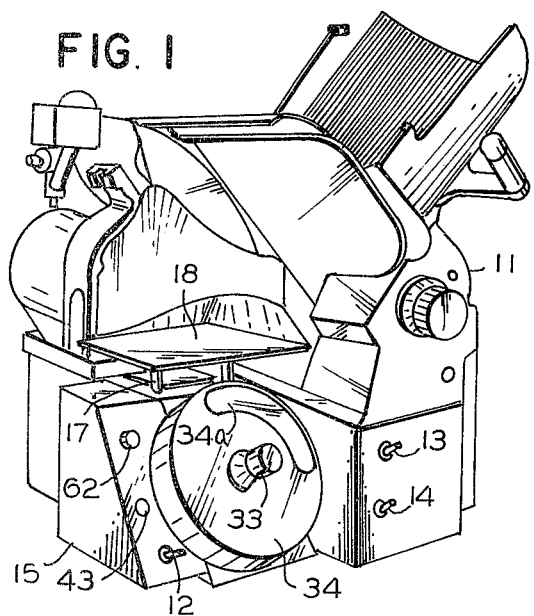
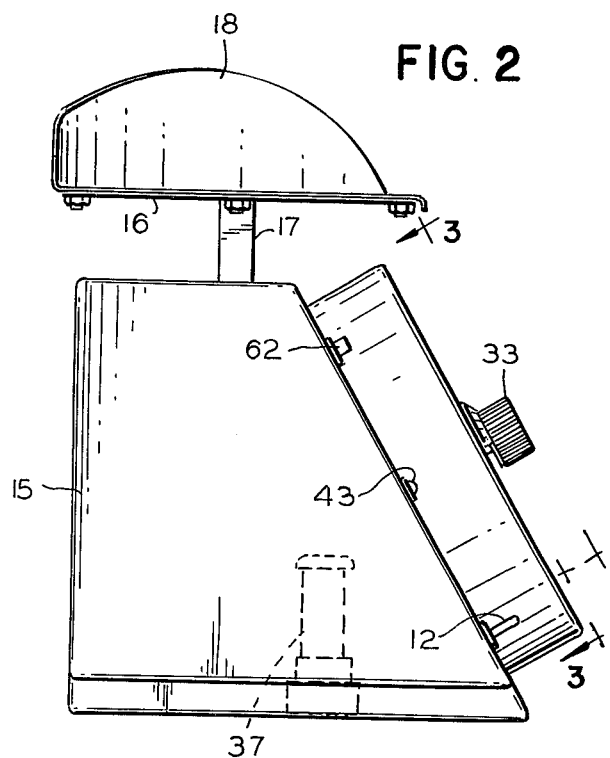
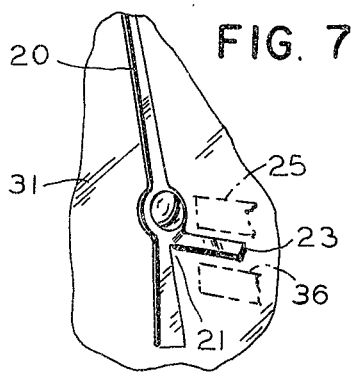
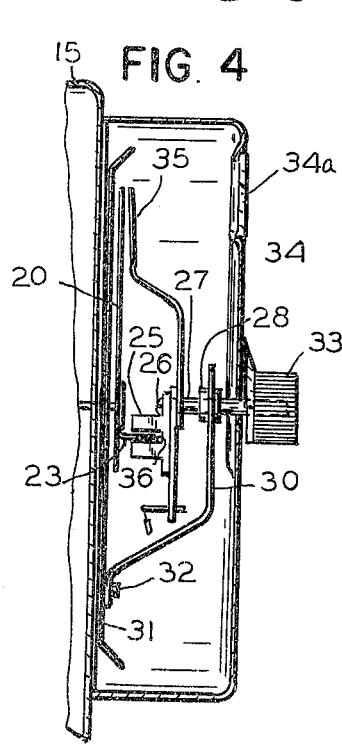
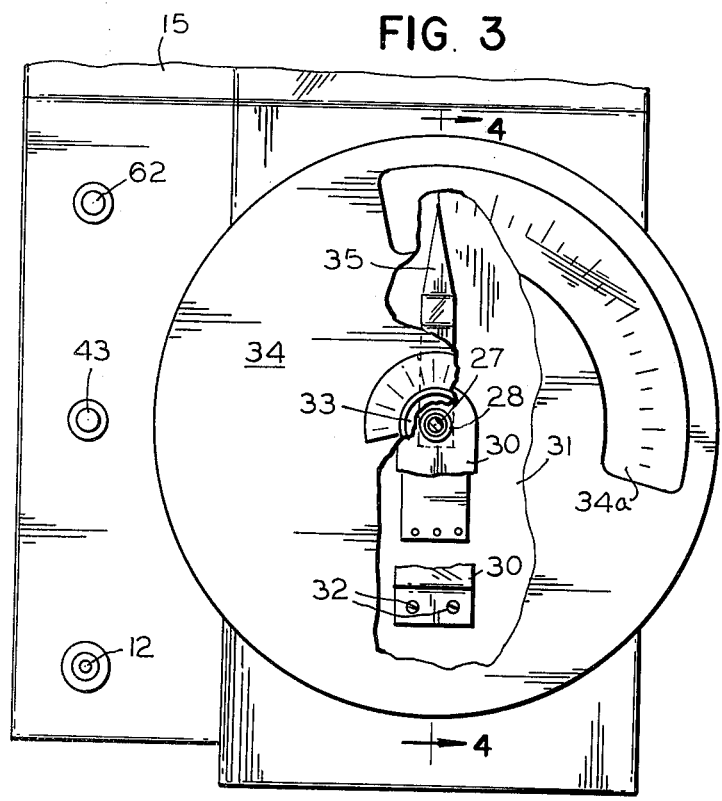

SLICING SYSTEM WITH AUTOMATIC PORTION WEIGHT CONTROL

BACKGROUND OF THE INVENTION

This invention relates to the slicing of food products as, for example, in restaurant and delicatessen operations and, more particularly, to the automatic slicing apparatus useful in such operations.

The making of sandwiches in restaurants and delicatessens often requires the slicing of a food product into an integral number of slices which are then used to make the sandwich. Operators of such establishments seek to establish uniformity in the sizes of the individual portions incorporated in their sandwiches and this has heretofore posed a difficult problem. The automatic slicing machines operate rapidly and efficiently to slice the food product, but the operator has no means of accurately and automatically ascertaining the weight of the portions produced and, accordingly, can only estimate the total weight of the product that he cuts. It is time consuming for the operator to check his estimate by weighing the slices. Furthermore, if he finds that he is over the desired weight, oftentimes there is nothing he can do with the extra slice or slices except to include them in the sandwich.

It is accordingly the primary purpose of the present invention to provide apparatus for automatically controlling the weight of individually sized portions of sliced food products prepared by an automatic slicing machine. It is a further object of the present invention to provide such apparatus that will accurately determine an individually sized portion of a food product having a desired preselected weight.

It is a still further object of the present invention to provide such apparatus that will avoid the necessity for the operator of an automatic slicing machine periodically to check his estimate of the correct weight for a preselected individually sized portion of a sliced food product.

SUMMARY OF THE INVENTION

Our system for slicing food products into accurately controlled individually sized portions having a preselected weight comprises automatic slicing means for slicing a food product into a number of slices and electric motor means operably connected to such slicing means for operating the same. Normally closed circuit means connect the motor means to the slicing means and to a source of electric power.

Scale means are operably associated with the slicing means for weighing the slices of food product cut. Such scale means comprise a receiving platform for receiving the slices and an indicating element for indicating the weight of the slices received on the receiving platform.

Photosensitive means are disposed adjacent the path of the indicating element for detecting the proximity of the same at a preselected location corresponding to a preselected weight of food product and for opening the circuit means to stop the automatic slicing means. Means are also provided to adjust the position of the photosensitive means relative to the indicating element for causing the circuit means to open at the preselected location thereof.

Our system further comprises time delaying means for delaying the time at which the photosensitive means is effective to open the circuit means, such time delay means being effective to delay the opening of said circuit means by an amount of time sufficient to compensate for any oscillation of the indicating element beyond the preselected location.

Desirably, the indicating element may comprise a pointer mounted on the scale dial and includes an upstanding leg on an end thereof, such leg being adapted to actuate the photosensitive means upon said pointer reaching said preselected location.

BRIEF DESCRIPTION OF THE DRAWINGS

FIG. 1 is a perspective view of the apparatus of the invention;

FIG. 2 is a side elevational view, to an enlarged scale and with parts broken away, of the apparatus of FIG. 1;

FIG. 3 is a view taken on line 3—3 of FIG. 2;

FIG. 4 is a sectional view taken on line 4—4 of FIG. 3;

FIG. 7 is a view of a scale pointer suitable for use in the invention.

DESCRIPTION OF THE PREFERRED EMBODIMENT

Figure 5:
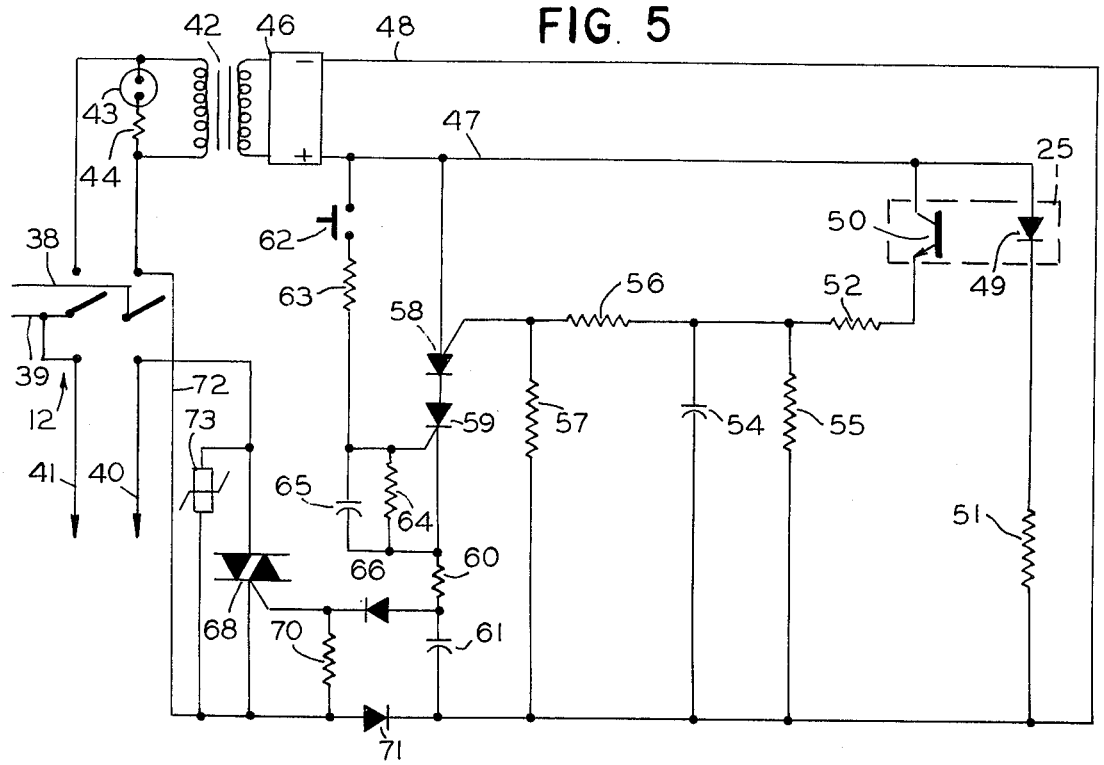
FIG. 5 is an electrical diagram illustrating a circuit suitable for incorporation in the present invention.

Referring to the drawings there is disclosed a slicing system 10 which automatically controls the weight of individually sized portions of a sliced food product. The system includes a gravity feed automatic food slicer 11, such as the type manufactured by Globe Slicing Machine Co., Stamford, Conn., and which is capable of thinly slicing food products such as cooked meats and the like. The slicer 11 herein illustrated is provided with separate blade and carriage motors (not shown), each having its respective control switch. The slicer 11 is wired such that for repeated use, a carriage switch 13 and a motor switch 14 may be left in the "On" position.

A scale 15 having a mounting plate 16 mounted on a support 17 carries a removable stainless steel receiving platform 18 designed to receive products from the slicer 11. The platform 18 is removably mounted on the plate 16, thus to be easily cleaned. Slices of the product actuate the scale 15 as they are received on the platform 18, causing movement of the scale pointer 20 in the normal clockwise direction as the slices cause downward movement of the platform 18 with respect to the scale.

The trailing end of the scale pointer 20 (FIG. 7) is desirably split as indicated at 21, and one part thereof is bent outwardly into an upstanding leg 23 for actuating photosensitive means which are a feature of the present invention. Such means, which, for example, may desirably comprise a photon coupled interrupter 25 manufactured by General Electric Company as part No. GE H13B1 or as Texas Instruments part No. TI 138, is mounted by a screw 26 on a nylon shaft 27 received in a brass bushing 28 disposed in a mounting bracket 30 attached to the face 31 of the scale 15 by an adjustable screw 32. The shaft 27, which desirably comprises a knurled outer end 33, is adapted to pass through an opening in a cover 34 for the scale which has a window 38a. An indicating needle 35 is also attached to the shaft 27 by the screw 26 for setting by the operator at a desired scale reading. The screw 32 for the mounting bracket 30 permits adjustment thereof relative to the scale pointer 20 such that the upstanding leg 23 can pass through the opening 36 in the interrupter 25, as shown. Rotation of the shaft end 33 is effective to establish a position of the indicator needle 35 and a corresponding position of the interrupter 25 such that the upstanding leg 23 on the pointer 20 will break the photoelectric beam passing through the interrupter 25 upon the pointer 20 reaching the position of the indicator needle 35. The position of needle 35 can be viewed by the operator through the window 34a.

The scale 15 has an air-pot 37 incorporated therein for damping and minimizing vibration of the pointer 20 caused by slices being dropped on the platform 18. Such avoids excessive oscillation and premature interruption of the circuit which might otherwise occur as the number of slices approaches the preselected weight.

Referring to FIG. 5, illustrating a first circuit which may be employed according to the present invention, input connections 38 and 39 from a conventional source are connected to the movable terminals of double pull double throw switch 12. When switch 12 is thrown to its lower position, leads 40 and 41 which are connected to the slicer are energized directly as when non-automatic operation is desired. With the switch 12 thrown to its upper position, the primary winding of transformer 42 is energized together with indicating lamp 43 connected in series with resistor 44 across such primary winding. The secondary of the transformer is adapted for supplying a lower AC voltage to bridge rectifier circuit 46 having positive and negative output leads 47 and 48, the latter providing a common return for the remainder of the FIG. 5 circuit.

Interrupter 25 comprises a light emitting diode 49 for supplying a light beam directed toward photo transistor 50 across the opening 36. Light emitting diode 49 is disposed in series with resistor 51 and the combination is interposed between leads 47 and 48. The collector of photo transistor 50 is coupled to positive lead 47, and its emitter is coupled via resistor 52 to a first terminal of delay capacitor 54 having its remaining terminal returned to lead 48. Capacitor 54 is shunted by resistor 55 which slowly bleeds off the charge from capacitor 54, with the capacitor preventing an immediate rapid change in voltage across resistor 55 should the status of conduction through photo transistor 50 change as by interruption of the light beam generated from light emitting diode 49. In this manner, operation of the circuit for disconnecting slicer 11 is inhibited when the pointer 20 "overshoots" momentarily. Thus, this delaying means is effective to delay circuit opening by an amount of time sufficient to compensate for oscillation of the scale pointer beyond a preselected location.

A series combination of resistors 56 and 57 form a voltage divider across capacitor 54 with the mid point thereof connected to the emitter of programmed unijunction transistor 58. The principal base terminals of transistor 58 are coupled between lead 47 and the anode of silicon controlled rectifier 59, the cathode of which is connected to lead 48 by way of resistor 60 and capacitor 61 connected in series. A momentary push button switch 62 is interposed between lead 47 and a resistor 63 the remote end of which is coupled to the control terminal of silicon controlled rectifier 59. A resistor 64 returns the control terminal of silicon controlled rectifier 59 to the cathode thereof, while a capacitor 65 shunts the last mentioned resistor for the purpose of preventing stray pickups from affecting the operation of the silicon controlled rectifier.

The mid point between components 60 and 61 is connected to the cathode of a diode 66, the cathode of which is coupled to the control terminal of triac 68 as well as to one end of a resistor 70, while the remaining end of resistor 70 is connected to the anode of a diode 71 having its cathode returned to lead 48. It will be seen that current from bridge rectifier output lead 47 flows through unijunction transistor 58, silicon controlled rectifier 59, resistor 60, diode 66, resistor 70, and diode 71 to lead 48, assuming all the aforementioned elements are in a conductive condition. At such time the drop across resistor 70 will maintain triac 68 in an On condition whereby current from switch 12 via lead 72 is coupled through the triac to lead 40 for empowering slicer 11. Lead 72 is connected to the junction between resistor 70 and diode 71 as well as to one terminal of triac 68. Triac 68 is shunted by metal oxide varister 73 for the prevention of too high a voltage drop across triac 68 under transient conditions. Capacitor 61 functions in a manner similar to capacitor 65 for preventing unwanted pickup from energizing triac 68.

The circuit of FIG. 5 is started by depressing momentary contact switch 62 which energizes silicon controlled rectifier 59 such that the aforementioned series circuit is established therethrough. It will be assumed photo transistor 50 is receiving light at this time and therefore a charge exists across capacitor 54 for establishing conduction through unijunction transistor 58. Consequently, when momentary contact switch 62 is depressed, triac 68 will be energized and an alternating current circuit will be completed to output leads 40 and 41 for energizing the slicer. Then, when the light beam of light emitting diode 49 is interrupted by the interposition of leg 23, the charge in capacitor 54 will be drained off by resistor 55 and unijunction transistor 58 will cease to conduct causing the discontinuance of conduction through triac 68 and disconnection of the slicer.

Figure 6:
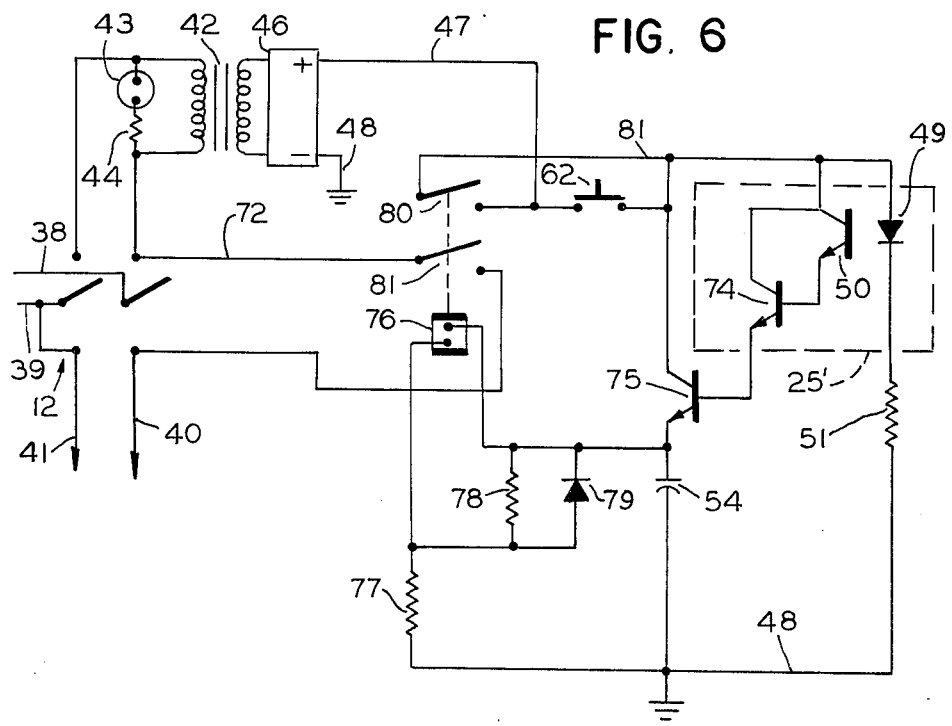
FIG. 6 is an electrical diagram illustrating an alternate embodiment of a circuit suitable for incorporation in the present invention.

An alternative circuit embodiment employing an electromagnetic relay is illustrated in FIG. 6 wherein similar elements are referred to by similar reference numerals. Interrupter 25' includes light emitting diode 49, photo transistor 50, and a second transistor 74 disposed in a Darlington circuit with transistor 50. A third transistor stage 75 is similarly driven by transistor 74 and the emitter of transistor 75 is connected to the ungrounded terminal of delay capacitor 54 having the series combination of relay control coil 76 and voltage dividing resistor 77 disposed thereacross. Shunted across relay control coil 76 is a second voltage dividing resistor 78 and a diode 79 wherein the latter is adapted to dissipate conductive overshoot of the relay coil. A first set of relay contacts 80 are interposed between positive power lead 47 and connection 81 for supplying the interrupter 25' and transistor 74. Momentary contact push button 62 is shunted across contact 80. A second set of contacts 81 is interposed between lead 72 empowered when switch 12 is in an upper position, and output lead 40 connected to the slicer. When momentary push buttom 62 is depressed, capacitor 54 is charged and relay coil 76 is energized for closing relay contacts 80 and 81. Contacts 80 hold the circuit for the interrupter and transistor 75. Contacts 81 close the circuit to lead 40 for empowering slicer 11. Then, when leg 23 interrupts the light beam from the light emitting diode, the circuit from the emitter of transistor 75 through relay coil 76 is deenergized and the relay contacts drop out for turning off the slicer. Again, capacitor 54 has the function of said delaying the turn-off of the slicer whereby the apparatus is not subject to scale bounce as when a slice of meat drops upon the platform 18, but rather the apparatus will be responsive to the actual measured weight. The time constant of the circuit including capacitor 54 in the case of either the FIG. 5 or the FIG. 6 embodiment is such that the capacitor charges substantially to the applied voltage in just over the period of time required for the scale to recover from the bounce.

As indicated in the electrical circuit diagrams, FIGS. 5 and 6, a normally closed circuit is provided for energizing the slicer carriage motor. Upon the preselected weight of the slices being received on the platform 18 to cause the pointer leg to break the photoelectric beam in the interrupter 25, the circuit is opened to the carriage motor. Such will cause the slicer to stop slicing the product, thereby to produce an exact preselected weight of thinly sliced food product constituting an individual portion for a sandwich or the like.

Placing the switch 12 in the opposite On position enables the slicer 11 to be used without the scale 15 or without shutting off the carriage motor should such be desired. In this way the slicer can be used for other conventional requirements, or the slicer can be used if the scale has been damaged or malfunctions.

Prior to serving operations, the operator adjusts the position of the indicator needle 35 with respect to the face 31 of the scale by turning the shaft 27 until a desired weight is indicated. Assuming the automatic portion control to be used, a piece of food product is placed in position for slicing on the slicer 11, momentary contact button 62 is depressed and will function automatically to initiate slicing of a first slice which, upon being cut, drops on the receiving platform 18 of the scale. As the slicer 11 continues automatically to cut additional slices and to drop them on the receiving platform 18, the accumulated weight of slices on the platform causes rotation of the scale pointer 20 until the same reaches the position of the indicator needle 35, whereupon the upstanding leg 23 on the pointer 20 interrupts the photoelectric beam through the interrupter 25 and opens the circuit to interrupt electric power to the carriage motor. The slicer 11 will then stop, an integral number of slices having been cut weighing the amount desired by the operator and constituting an exact individually sized portion for a sandwich.

Although the invention is particularly adaptable for use in producing exact individually sized portions of a preselected weight for use in sandwiches in restaurants and delicatessen operations, the system may also be used for checking the weight of meat or other entree portions in regular restaurant or banquet operations, especially when slices are being made from inconsistently sized roasts.

The invention is also applicable to other electrical systems incorporating a normally closed electrical circuit and a measuring instrument having a movable indicating element disposed within such circuit, as, for example, in an oven having a thermometer with a movable indicating element. Photoelectric means disposed adjacent the path of the indicating element on the thermometer detect photoelectrically the proximity of such indicating element at a preselected position thereof to break the circuit in the oven and cause heating thereof to stop.

We claim:
1. In a system for slicing food products into accurately controlled individually sized portions of preselected weight, the combination comprising:
   a. automatic slicing means for slicing a food product into a number of slices to constitute an individually sized portion,
   b. electric motor means operably connected to said slicing means for operating the same,
   c. electric circuit means for connecting said electric motor means to a source of electric power,
   d. scale means operably associated with said slicing means for weighing said slices of food product, said scale means comprising a movable receiving platform disposed below the slicing means for receiving said slices dropped thereonto by gravity from the slicing means, and a movable pointer for indicating the weight of said slices received on said receiving platform,
   e. electric motor control switch means in the electric circuit means of the motor means for selectively opening and closing said circuit means for activating and deactivating the motor means,
   f. electric actuator means for said switch means, the actuator means having an electric control circuit,
   g. photosensitive switch means in said electric control circuit disposed adjacent the path of said movable pointer for detecting the proximity of the same at a preselected location corresponding to said preselected weight and for opening said electric control circuit and switch means to stop said automatic slicing means,
   h. means to adjust the position of the photosensitive means relative to said movable pointer for causing said electric control circuit to open at said preselected location of said pointer, and
   i. time delay means in the electric control circuit for delaying actuation of the electric motor control switch means by the photosensitive switch means for a period of time sufficient to allow recovery of pointer oscillation beyond said preselected location resulting from the dropping of food slices onto the receiving platform.

2. The combination of claim 1 wherein the electric motor control switch means comprises a triac, the actuator means therefor comprises the control terminal of the triac, and the electric control circuit includes an electric supply circuit connected to said control terminal of the triac, and a programmed unijunction transistor in said supply circuit, the control terminal of said programmed unijunction transistor being connected to the photosensitive switch means.

3. The combination of claim 8 wherein the electric motor control switch means comprises a relay contact, the actuator means therefor comprises the relay coil, and the electric control circuit includes an electric supply circuit connected to said coil, and the collector-emitter circuit of a transistor in said supply circuit, the base component of said transistor being connected to the photosensitive switch means.

* * * * *

UNITED STATES PATENT OFFICE
CERTIFICATE OF CORRECTION

PATENT NO. : 3,938,602

DATED : 17 February 1976

INVENTOR(S) : Eugene L. Sly and Dean R. Salmans

It is certified that error appears in the above-identified patent and that said Letters Patent are hereby corrected as shown below:

Column 6, line 58, "8" should read --1--.

Signed and Sealed this eleventh Day of May 1976

[SEAL]

Attest:

RUTH C. MASON
Attesting Officer

C. MARSHALL DANN
Commissioner of Patents and Trademarks